United States Patent [19]
Warfield

[11] Patent Number: 5,232,563
[45] Date of Patent: Aug. 3, 1993

[54] METHOD OF CLEANING A SEMICONDUCTOR WAFER

[75] Inventor: Timothy J. Warfield, Tempe, Ariz.

[73] Assignee: Motorola, Inc., Schaumburg, Ill.

[21] Appl. No.: 920,070

[22] Filed: Jul. 27, 1992

[51] Int. Cl.$^5$ ................................................ C25F 1/00
[52] U.S. Cl. ...................................................... 204/141.5
[58] Field of Search ........................................ 204/141.5

[56] References Cited

U.S. PATENT DOCUMENTS 3,042,593  7/1962  Michlin ........................ 204/129.85
4,264,418  4/1981  Wood ............................. 204/141.5

OTHER PUBLICATIONS

Juan Bardina, "Methods for Surface Particle Removal: A Comparative Study", Particulate Science and Technology, pp. 6:121-131, 1988.

*Primary Examiner*—T. M. Tufariello
*Attorney, Agent, or Firm*—Joe E. Barbee; Robert F. Hightower

[57] ABSTRACT

A method of removing contaminants (16) from a semiconductor wafer (10) includes placing the semiconductor wafer (10) into an ionic solution (19). A plurality of bubbles (24) are created along the surface of the semiconductor wafer (10). The bubbles (24) lift the contaminants (16) from the wafer (10) thereby floating the contaminants (16) off the wafer (10) and producing a clean wafer (10). Since the bubbles (24) form along the surface of the wafer's (10) recesses (14), contaminants (16) within the recess (14) are removed. The bubbles facilitate removing both organic and inorganic contaminants (16).

15 Claims, 1 Drawing Sheet

METHOD OF CLEANING A SEMICONDUCTOR WAFER

BACKGROUND OF THE INVENTION

The present invention relates, in general, to semiconductor processing techniques, and more particularly, to a novel method of cleaning semiconductor wafers.

During the various processing steps required to transform a semiconductor wafer into semiconductor devices, process by-products and other contaminants often are left on the semiconductor wafer and in recesses, such as trenches, that have been formed in the wafer. In the past, a variety of chemical, mechanical, and combined chemical-mechanical methods (such as ultrasonic and megasonic cleaning) have been employed to remove these contaminants. The contaminants often are a combination of materials including organic materials resulting from photoresist resins, fluoro-polymers that result from fluorine plasma etching operations, and inorganic materials including silicon particles.

Previous wafer cleaning methods typically can not remove such combinations of materials. Chemical cleaning methods generally can remove either organic materials or inorganic materials, but not both. Combined chemical-mechanical cleaning methods do not overcome these deficiencies. In addition, combined chemical-mechanical methods generally are not capable of removing small particles, less than one-half micron, that settle into the wafer's small recesses.

Accordingly, it is desirable to have a method of cleaning semiconductor wafers that can remove both organic and inorganic contaminants, that can remove small (less than one-half micron) contaminants, and that can remove contaminants from the wafer's small recesses.

SUMMARY OF THE INVENTION

Briefly stated, the present invention provides a method of removing contaminants from a semiconductor wafer. A plurality of bubbles are created along the surface of the semiconductor wafer. The bubbles lift the contaminants from the wafer thereby producing a clean wafer. Since the bubbles form along the surface of the wafer's recesses, contaminants within the recess are removed. The bubbles facilitate removing both organic and inorganic contaminants.

DETAILED DESCRIPTION OF THE DRAWINGS

Figure 1:
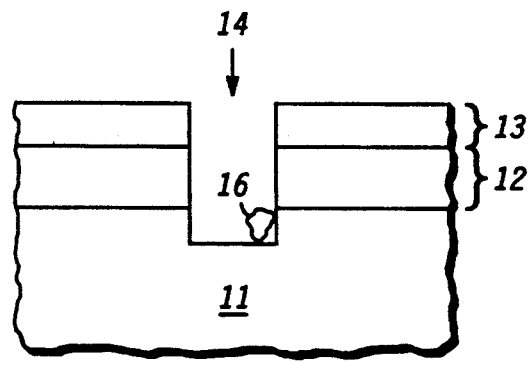
FIG. 1 illustrates an enlarged cross-sectional portion of a semiconductor wafer.

FIG. 1 illustrates an embodiment of a contaminated semiconductor wafer 10 having a contaminant 16 that subsequently will be removed. Wafer 10 includes a semiconductor substrate 11 which may be intrinsic, or doped N-type or P-type. Substrate 11 may be covered with a doped layer 12. In some cases, layer 12 may be covered with a dielectric layer 13. Layers 12 and 13 are not required but are illustrated for clarity in explaining the wafer cleaning method. Wafer 10 also includes a recess in the form of a trench 14 that has been formed in the surface of wafer 10. Contaminant 16 is a by-product created by previous wafer processing operations, and has settled into trench 14. Contaminant 16 can be organic, inorganic, or a combination of both, and typically has a size that is smaller than one-half of a micron.

Figure 2:
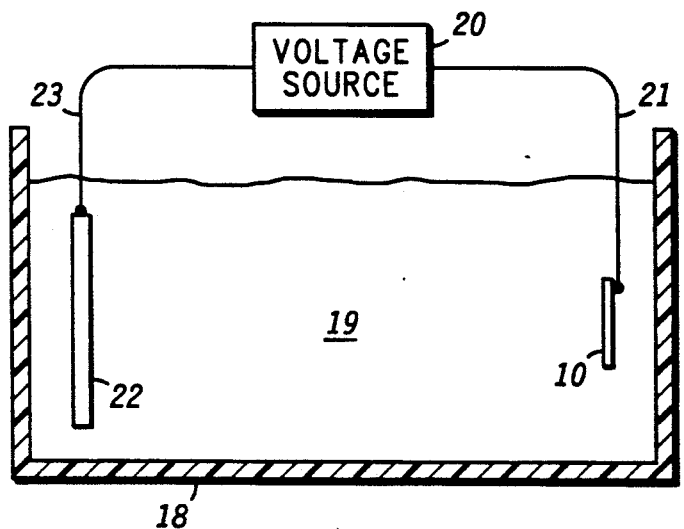
FIG. 2 illustrates a wafer cleaning apparatus in accordance with the present invention.

FIG. 2 illustrates a cleaning apparatus 17 that is suitable for cleaning a variety of articles and wafer configurations including wafer 10 of FIG. 1. Cleaning apparatus 17 includes a container 18 that holds an ionic solution 19. Solution 19 is electrically conductive and supports current flow between an electrode 22 that is positioned within solution 19, and wafer 10 of FIG. 1 which functions as a second electrode within solution 19. Solution 19 includes water, an ionic conductor, and a non-ionic surfactant. The ionic conductor provides a current transport mechanism between electrode 22 and wafer 10. Hydrochloric acid and nitric acid are two ionic conductors that can be used in solution 19. The non-ionic surfactant facilitates removing contaminant 16 as will be seen hereinafter. Non-ionic surfactants are used in order to prevent contaminating wafer 10 with mobile ions. Sulfonic acids, and high molecular weight alcohols, generally in excess of 300, are suitable materials for the non-ionic surfactant. In the preferred embodiment, solution 19 contains water, approximately 0.5% to 2.0% by volume of hydrochloric acid as the ionic conductor, and approximately 1.0% by volume of sulfonic acid as the non-ionic surfactant.

Electrode 22 is connected to one terminal of a voltage source 20 by a conductor 23, and wafer 10 is connected to a second terminal of voltage source 20 by a conductor 21. Electrode 22 is inert in order to prevent contaminating wafer 10. In addition, electrode 22 should have an area between two and one hundred times the area of wafer 10 in order to promote formation of the electrolysis reaction at wafer 10. In the preferred embodiment, electrode 22 is a approximately 70 square centimeters (cm.) of silicon.

The voltage applied to electrode 22 and wafer 10 should be sufficient to decompose the water in solution 19. Typically, about 1.5 to 2.0 volts is sufficient. In the preferred embodiment, a voltage of approximately 2.0 volts is utilized. As the water decomposes, oxygen bubbles are formed at the positive electrode and hydrogen bubbles are formed at the negative electrode. In addition, the positive electrode may also decompose small amounts of the ionic conductor. In the preferred embodiment, a small amount of chlorine may be formed at the positive electrode due to decomposition of the hydrochloric acid used for the ionic conductor. Wafer 10 typically is attached to the positive terminal of source 20 since the oxygen bubbles can oxidize some materials in contaminant 16 thereby promoting the removal of contaminant 16. In some cases, it is desirable to alternately reverse the electrical connections to prevent attracting electrostatic particles.

Figure 3:
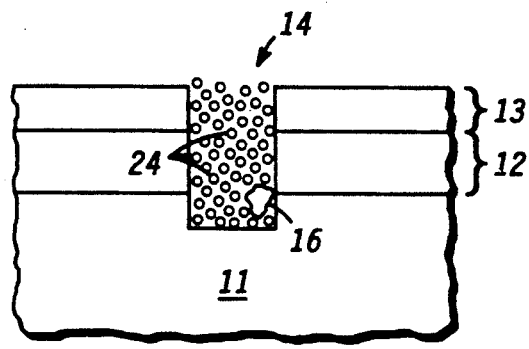
FIG. 3 illustrates a step in cleaning the wafer of FIG. 1 in accordance with the present invention.

FIG. 3 illustrates a portion of wafer 10 of FIG. 1 during the cleaning operation performed by apparatus 17 of FIG. 2. For the sake of clarity, this section will have references to both FIG. 2 and FIG. 3. The voltage applied to wafer 10 creates a plurality of bubbles 24 along the immersed conductive surfaces of wafer 10. Bubbles 24 are not created along the non-conductive surfaces such as dielectric 13. Since the plurality of bubbles 24 evolve from the surface of trench 14, bubbles 24 form between contaminant 16 and the surface of trench 14. Due to this formation mechanism, bubbles 24 lift contaminant 16 from the surface of trench 14. The amphipathy or detergent characteristic of the surfactant in solution 19 surrounds contaminant 16 with surfactant molecules thereby ensuring that bubbles 24 surround contaminant 16 thereby floating contaminant 16 out of trench 14, and is completely removing contaminant 16 from wafer 10. In addition, the surfactant in solution 19 also reduces the surface tension of solution 19 thereby ensuring that solution 19 can fill the small opening of trench 14. The electrolysis ensures that contaminants will be removed from any trench size and aspect ratio that can be formed with semiconductor processing methods. In the preferred embodiment, trench 14 has a width between approximately one-fourth of a micron and five microns, and a depth between one-half of a micron and ten microns.

The size and rate of bubble formation is determined by the current density along the surface of wafer 10. Low current densities produce small bubbles at a low rate, while high current densities produce large bubbles at high rates. In the preferred embodiment, a current density of approximately 0.05 amps/cm$^2$ is utilized to remove contaminants having sizes of less than 0.5 microns from a wafer 10 having trenches that occupy approximately 3.0% of the surface of wafer 10.

By now, it should be appreciated that there has been provided a novel method of cleaning a semiconductor wafer. Forming bubbles all along the wafer's exposed surface, ensures that bubbles will be formed within the wafer's small recesses. Also, evolving the bubbles from the surface ensures that the bubbles are formed between the contaminants and the surface thereby removing the contaminants. The method is independent of the contaminant's organic and inorganic material content. Controlling the bubble's size, by varying the current density, permits removing particles that are less than one-half micron in size from within the wafer's small recesses.

I claim:

1. A method of cleaning a semiconductor wafer comprising:
   providing a semiconductor wafer having recesses in a surface of the semiconductor wafer;
   preparing an ionic solution consisting essentially of water, an ionic conductor, and a non-ionic surfactant;
   immersing a semiconductor wafer into the ionic solution wherein the semiconductor wafer forms a first electrode;
   placing a second electrode into the ionic solution; and
   forming bubbles on a surface of the semiconductor wafer by applying a voltage between the first electrode and the second electrode thereby causing current to flow between the semiconductor wafer and the second electrode wherein the bubbles remove contaminants from within the recesses.

2. The method of claim 1 wherein preparing the ionic solution includes mixing by volume the water, approximately 2% to 10% hydrochloric acid as the ionic conductor, and approximately 0.5% to 2% of the non-ionic surfactant.

3. The method of claim 2 wherein mixing the by volume solution includes selecting the non-ionic surfactant from the group consisting of sulfonic acids and alcohols having a molecular weight greater than 300.

4. The method of claim 1 wherein the forming bubbles step includes causing current having a current density of approximately 0.05 amps per square cm. to flow from the semiconductor wafer to the second electrode.

5. The method of claim 1 wherein placing the second electrode into the ionic solution includes placing an inert electrode into the ionic solution.

6. The method of claim 1 wherein placing the second electrode into the ionic solution includes placing a silicon electrode having an area of approximately 70 square cm into the ionic solution.

7. A method of removing contaminants from a semiconductor wafer comprising:
   immersing a portion of a semiconductor wafer into an ionic solution consisting essentially of water, an ionic conductor, and a non-ionic surfactant; and
   forming bubbles along a surface of the portion of the semiconductor wafer by causing a current to flow between the surface and the solution wherein the bubbles lift the contaminants from the wafer.

8. The method of claim 7 wherein immersing the portion of the semiconductor wafer into the ionic solution includes mixing by volume approximately 0.5% to 2% of the non-ionic surfactant, approximately 2% to 10% of the ionic conductor, and the water.

9. The method of claim 8 wherein mixing by volume approximately 0.5% to 2% of the non-ionic surfactant includes selecting the non-ionic surfactant from the group containing alcohols having a molecular weight in excess of approximately 300, and sulfonic acids.

10. The method of claim 7 wherein forming bubbles along the surface of the portion of the semiconductor wafer by causing the current to flow includes causing the current having a current density of approximately 0.05 amps per square cm to flow.

11. A method of removing contaminants comprising:
    immersing a surface of an article into an ionic solution having a non-ionic surfactant; and
    evolving bubbles from the surface for the purpose of lifting contaminants from the surface.

12. The method of claim 11 further including surrounding the contaminant with a surfactant.

13. The method of claim 11 wherein evolving bubbles form the surface includes applying a voltage to the surface wherein the voltage decomposes a portion of the ionic solution.

14. The method of claim 13 wherein applying the voltage includes applying the voltage between the surface and a silicon electrode having an area of approximately 70 square centimeters.

15. The method of claim 14 wherein applying the voltage between the surface and the silicon electrode includes periodically reversing a polarity of the voltage.

* * * * *